United States Patent
Chang et al.

(10) Patent No.: US 7,503,022 B2
(45) Date of Patent: Mar. 10, 2009

(54) TEST METHOD FOR UNIT RE-MODIFICATION

(75) Inventors: Dyson Chang, Hsin Tien (TW); Daniel Kao, Hsin Tien (TW)

(73) Assignee: Via Technologies, Inc., Taipei Hsien (TW)

(*) Notice: Subject to any disclaimer, the term of this patent is extended or adjusted under 35 U.S.C. 154(b) by 135 days.

(21) Appl. No.: 11/187,946

(22) Filed: Jul. 25, 2005

(65) Prior Publication Data

US 2006/0041850 A1 Feb. 23, 2006

(30) Foreign Application Priority Data

Aug. 20, 2004 (TW) .............................. 93125267 A

(51) Int. Cl.
*G06F 17/50* (2006.01)

(52) U.S. Cl. ............................................. 716/4; 716/5

(58) Field of Classification Search ................. 716/4–5, 716/2

See application file for complete search history.

(56) References Cited

U.S. PATENT DOCUMENTS 6,825,887 B2 * 11/2004 Miller et al. ................. 348/708

* cited by examiner

*Primary Examiner*—Vuthe Siek
(74) *Attorney, Agent, or Firm*—Birch, Stewart, Kolasch & Birch, LLP

(57) ABSTRACT

The present invention described a test method for unit re-modification, in which there is a test end and a host end. The method generated a sample pattern at a test end, generates a control pattern and modifies a re-modification unit. Otherwise, an experimental pattern is generated and then whether or not the original function is retained after modifying the re-modification unit is determined according to the result of comparison of the control pattern and experimental pattern thereon. The present invention is used to test the internal function module of specific software or hardware, and ensure that the proper function is retained after re-modification.

5 Claims, 4 Drawing Sheets

TEST METHOD FOR UNIT RE-MODIFICATION

BACKGROUND OF THE INVENTION

1. Field of the Invention

The present invention discloses a test method for unit re-modification, which is used to test and improve a function module, and ensures that the original function is as usual after modification.

2. Description of Related Art

In the usual test procedure of operational efficiency of an application software or appliance, the consideration of whether or not the output reaches the expected result or improvement is the only way to determine the efficiency thereof. Testing a specific efficiency or module optimization always requires an expensive experiment, as does any other improvement.

It is difficult to find out the cause of memory usage, circuit layout or a variety of elements of each unit module in a software or hardware system. Further, it is also hard to know whether the original function remains after re-modification or a modification process. In particular, if the unit module in a software or hardware system is located in the midst of the system there is no better related way to discover the cause.

The drawback of the prior art is that changes can only be observed before and after the re-modification or modification process, changes of each unit module of whole system cannot be particularly observed.

SUMMARY OF THE DISCLOSURE

The present invention discloses a test method that generates a control pattern and an experimental pattern before and after a re-modification unit respectively using identical sample patterns. The patterns are introduced to determine any change of a function module by comparing the experimental pattern with the control pattern. Then the comparison process of the method ensures that the original function is retained.

A preferable embodiment of this invention is to generate a sample pattern, and then a control pattern and an experimental pattern, accordingly. By comparing the control pattern with the experimental pattern, the test method can determine whether the unit module retains the original function thereof. This embodiment can be used to test the inner functional module of software or hardware, which ensures retention of the original function after modification.

The test method described above is used to optimize the test of the re-modification unit, and comprises the following steps: generating a sample pattern; inputting the sample pattern into the re-modification unit; generating an experimental pattern; modifying the re-modification unit and inputting the sample pattern into the modified re-modification unit; generating a control pattern; comparing the experimental pattern with the control pattern and determining whether the unit module has retained the original function after modification.

The second embodiment of the present invention comprises the following steps: recording a user operation instruction; generating reference data; generating a sample pattern, which is generated from the user operation instruction and the reference data; inputting the sample pattern; generating a recovery reference data; inputting the user operation instruction to the re-modification unit; generating first test data; feeding back the first test data to a application module; modifying the re-modification unit; inputting the sample pattern; generating recovery reference data; inputting the user operation instruction into the modified re-modification unit; generating second test data; feeding back the second test data to the application module; comparing the first test data with the second test data; and determining if the unit re-modification steps need to be repeated from diagnosing whether the original function is retained after the modification.

BRIEF DESCRIPTION OF DRAWINGS

The present invention will be readily understood by the following detailed description in conjunction accompanying drawings, in which.

DETAILED DESCRIPTION OF THE PREFERRED EMBODIMENTS

To allow the Examiner to understand the technology, means and functions adopted in the present invention, reference is made to the following detailed description and attached drawings. The Examiner shall readily understand the invention deeply and concretely from the purpose, characteristics and specification of the present invention. Nevertheless, the present invention is not limited to the attached drawings and embodiments in following description.

The present invention introduces a test method for unit re-modification, which is applied to improve the functional module of a software or hardware. The use for this test method for unit re-modification is to optimize the re-modification of memory usage, circuit layout, module or the elements therein. The invention adopts identical sample patterns, and an experimental and control pattern are generated before or after unit re-modification, respectively. Then, the unit re-modification process is used to ensure that the original function of the unit module is retained by comparing the two patterns.

Figure 1:
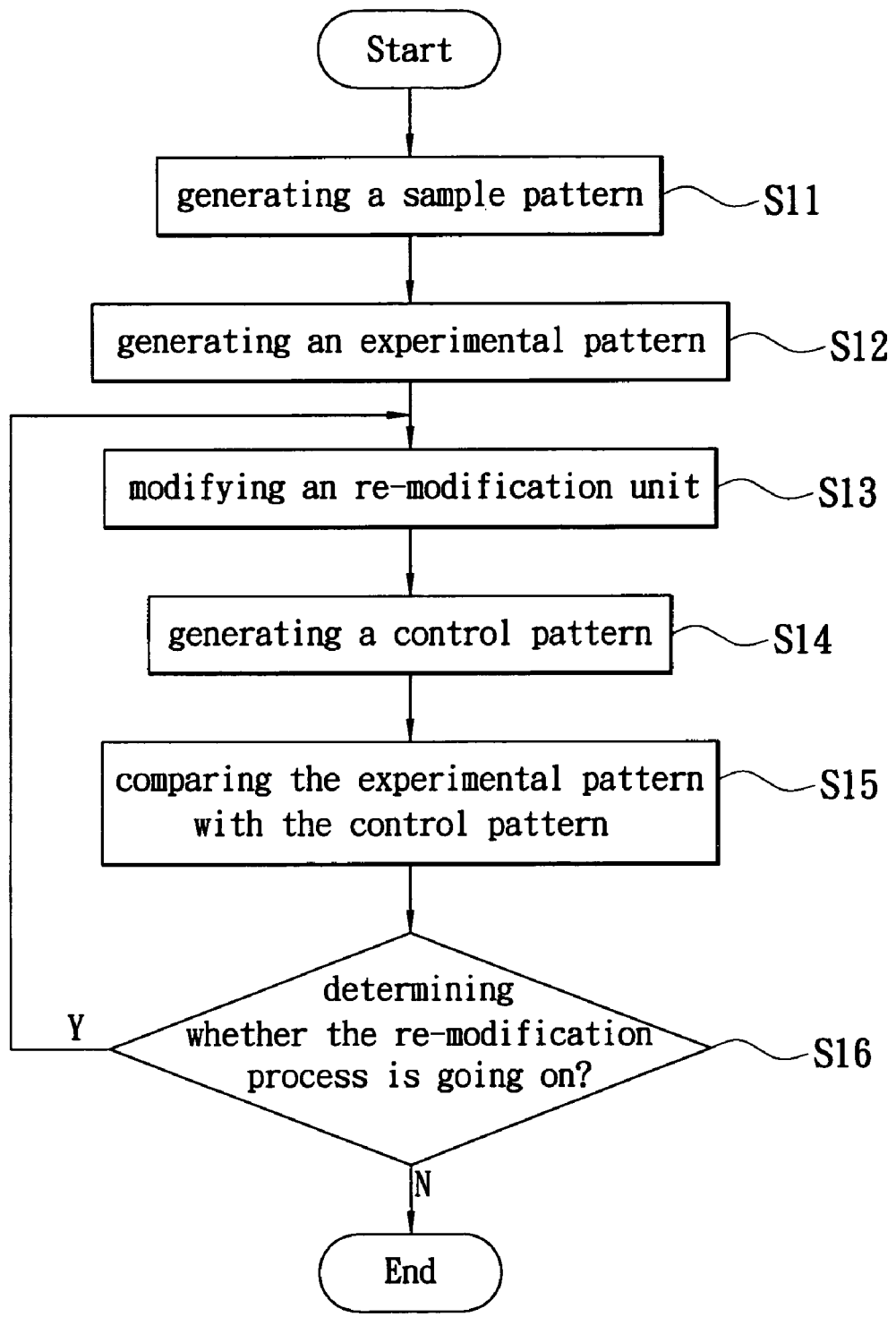
FIG. 1 is a flow chart of the test method of the present invention.

Reference is made to FIG. 1, which is a flow chart of the preferred embodiment of the present invention.

First, a sample pattern is generated. The mentioned initial sample pattern is formed by a record file recording the operation instruction of re-modification of a re-modification unit of some specific product. The record file can be the instruction of a hardware, firmware or a software operating process; (step S11)

After inputting the initial sample pattern into the re-modification unit, an experimental pattern is generated from the user operation instruction and the recovery reference data (step S12).

Meanwhile, the re-modification unit is modified, with the design of a functional module, memory usage, other related module requiring modification or the like (step S13).

A control pattern is generated after the sample pattern goes through the modified re-modification unit (step S14).

The experimental pattern mentioned above is compared with the control pattern; namely, the output data before and after the re-modification unit are compared (step S15).

According to the comparison results, the invention determines whether the original function is retained or improved, and whether the re-modification process needs to be continued (step S16).

If the re-modification process needs to be repeated, then the re-modification process in step S13 is performed. Otherwise, the process is terminated.

Figure 2:
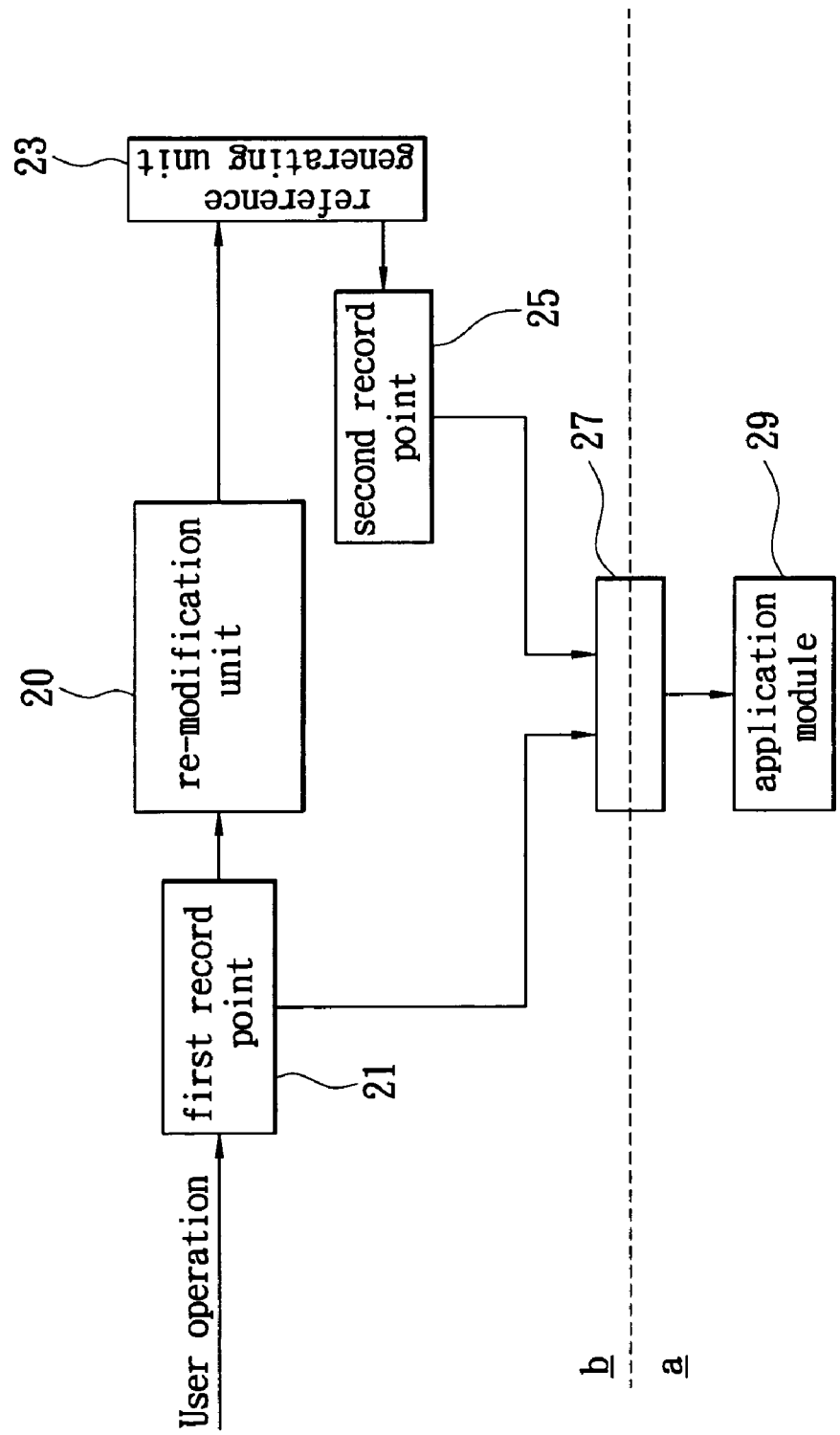
FIG. 2 illustrates a sample pattern generating structure of the present invention.

FIG. 2 shows the schematic structure to generate the sample pattern. A product is located at test end b, where a sample pattern is generated for the purpose of optimizing a specific functional module therein, or reducing the cost thereof.

A user operation instruction is recorded at a first record point 21, the information of the first record point 21 is transmitted to the re-modification unit 20, which needs to be modified. Meanwhile, the re-modification unit 20 is under an initial condition. The output from the re-modification unit 20 is produced by a reference generating unit 23, and reference data are reached and recorded at a second record point 25. The first record point 21 from the user operation instruction recorded above and the second record point 25 from the reference data are transmitted to an application module 29 of a host end a via a transmission interface 27. The transmission interface 27 can be the interface of well-known computer host, such as RS232 or USB, for example. The application module 29 can be the application program executed at the host end a. The application module 29 can be used to compare and generate the sample pattern, the experimental pattern, and the control pattern. Afterward, the experimental pattern and the control pattern are used for comparison when later diagnosing the re-modification unit 20.

Figure 3:
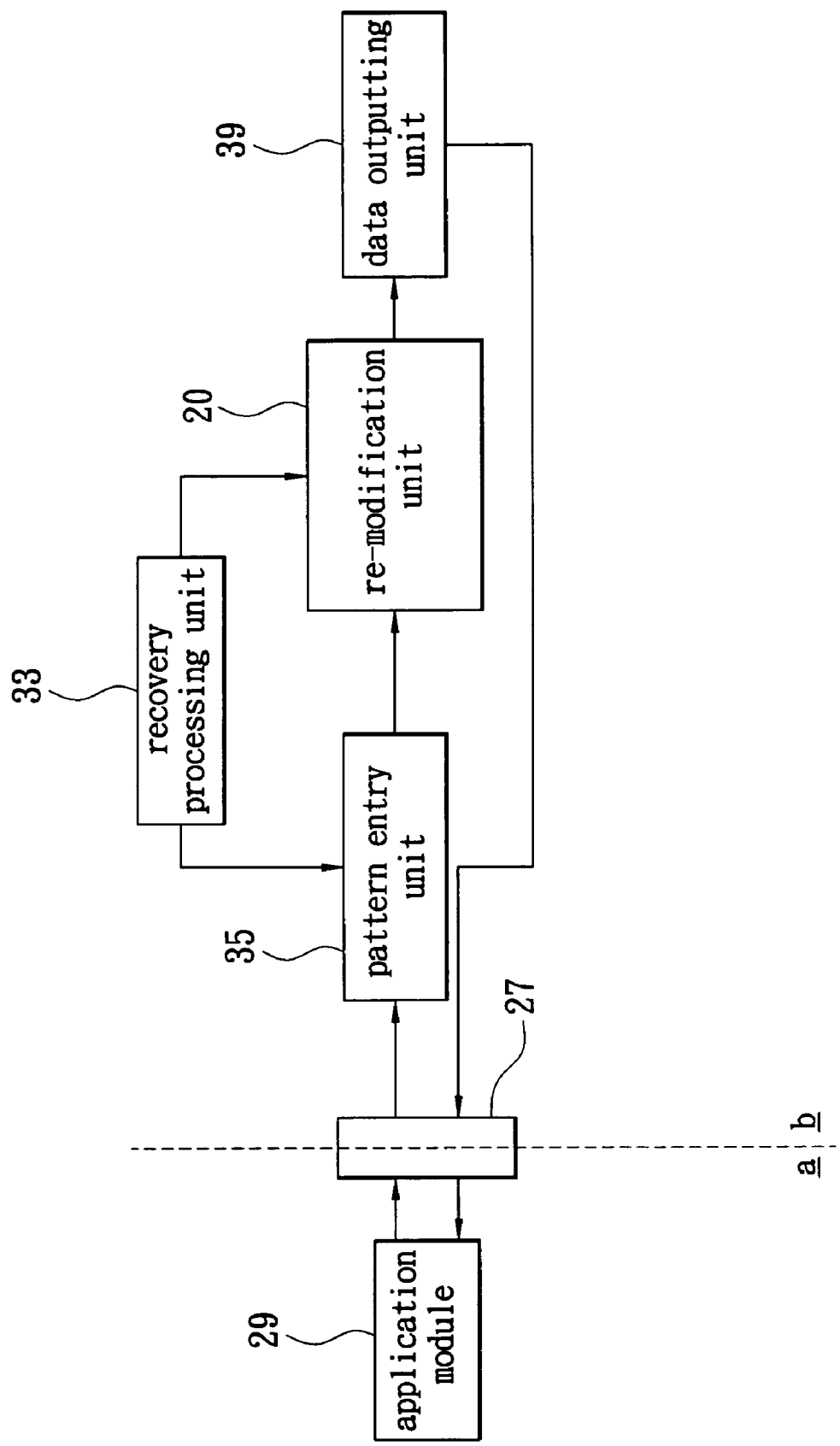
FIG. 3 illustrates a structure of the test method of the present invention.

FIG. 3 illustrates a structure of the test method of the present invention. The sample pattern recorded in the application module 29 is transmitted to a pattern entry unit 35 of the test end b via transmission interface 27. The information of the user operation instruction is transmitted to the re-modification unit 20. The reference data is transmitted to a recovery processing unit 33, and the data are transmitted to the re-modification unit 20 after recovery by the recovery processing unit 33.

The user operation instruction and recovery reference data are received by the re-modification unit 20, and then output into a data outputting unit 39 capable of latching after processing.

The output data are transmitted to the application module of the host via the transmission interface of the host end a, that used to be the data of the experimental pattern.

Figure 4:
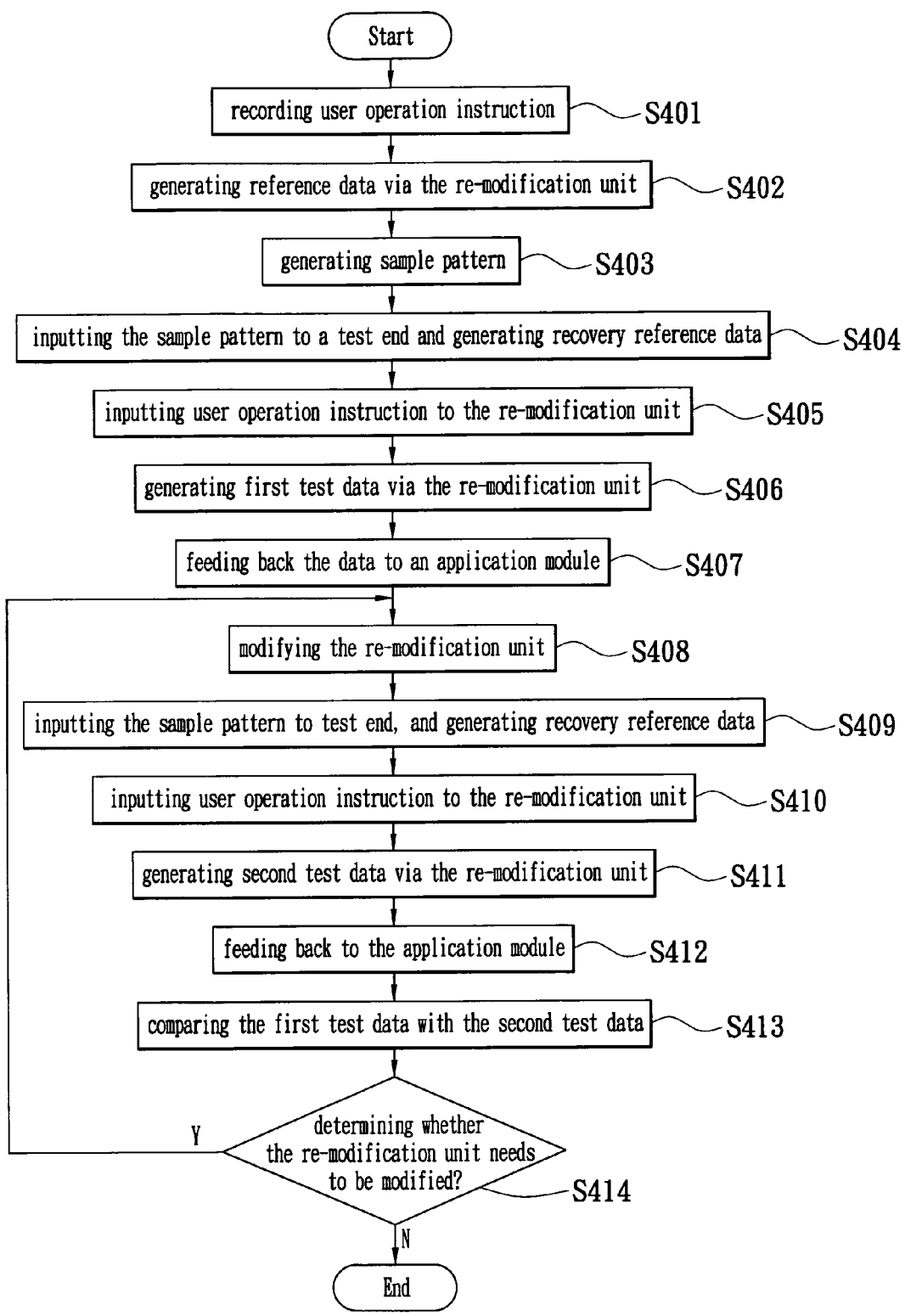
FIG. 4 is a flow chart of an embodiment of the present invention.

The aforementioned steps are repeated after modifying the re-modification unit 20, and a control pattern is generated. FIG. 4 is a flow chart of an embodiment of the present invention, and comprises the following steps. First, the steps for generating a sample pattern comprise the following steps. A user operation instruction is recorded, like the procedure for operating the software or hardware. For example, recording a user clicks the buttons of play, stop, forward, backward or pause on a DVD player, or a user operates the mouse, keyboard or any other instructions in a program (step S401). A reference data is generated via a re-modification unit, such as video playing, buttons operating, and recording the reference data at a record point (step S402). The user operation instruction and the reference data are transmitted to a host end via a transmission interface, and a sample pattern is generated by an application module (step S403). Generating an experimental pattern comprises the following steps. The sample pattern is transmitted to a pattern entry unit of the test end from the application module in the host end via the transmission interface, and after the reference data goes through a recovery processing unit, a recovery reference data is generated (step S404). The user operation instruction is input into the re-modification unit from the pattern entry unit (step S405). After the recovery reference data and the user operation instruction pass through the re-modification unit, first test data are generated (step S406). The first test data are fed back to the application module in the host end via the transmission interface (step S407).

Generating a control pattern comprises the following steps. After the first test data are generated, the re-modification unit can be modified according to the module optimization or memory usage, for example (step S408). By repeating the aforementioned steps, the sample pattern is input into the pattern entry unit in the test end, and recovery reference data are generated by the reference data passing through the recovery processing unit (step S409). The pattern entry unit inputs the user operation instruction of the sample pattern into the re-modification unit (step S410). Second test data are generated by the recovery reference data and the user operation instruction passing through the re-modification unit (step S411). The second test data are fed back to the application module via the transmission interface (step 412). The first test data and the second test data are compared in the application module (step 413). Whether the original function is retained after modification of said re-modification unit is determined by comparing the first test data and the second test data mentioned above, and determining whether the steps of the test method of the modified re-modification unit need to be continued, from step 408 to step 414.

Or, other test data are generated by modifying the re-modification unit, and determining whether the test method of the present invention is reached by comparing the other test data, the first test data, and the second test data (step S414).

Finally, by repeating the steps mentioned above, a plurality of test data are generated, and an optimization is reached by comparing those test data.

In particular, the present invention discloses a test method that generates a control pattern and an experimental pattern. The patterns are introduced to determine any change of function module by comparing the experimental pattern with the control pattern, and determining whether the original function is remained or be optimized by comparison.

The many features and advantages of the present invention are apparent from the written description above and it is intended by the appended claims to cover all. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A test method for unit re-modification, the test method being is used to optimize a re-modification unit, wherein the method comprises:

recording a user operation instruction;

generating reference data by inputting said user operation instruction into said re-modification unit, wherein said reference data is recorded at a record point;

generating a sample pattern according to a combination of said user operation instruction and said reference data;

inputting said sample pattern;

generating recovery reference data by recovering said reference data of said sample pattern, and then inputting said recovery reference data into said re-modification unit;

inputting said user operation instruction into said re-modification unit;

generating first test data through said re-modification unit receiving said user operation instruction and said recovery reference data;

feeding back said first test data into an application module;
modifying the re-modification unit;
inputting said sample pattern;
generating said recovery reference data by recovering said reference data of said sample pattern, and then inputting said recovery reference data into said re-modification unit;
inputting said user operation instruction into said re-modification unit;
generating second test data through said modified re-modification unit receiving said user operation instruction and said recovery reference data;
feeding back said second test data into said application module;
comparing said first test data with said second test data; and
determining whether an original function is retained after modifying said re-modification unit, and whether said steps of said test method need to be continued.

2. The method as recited in claim 1, wherein said sample pattern is generated by said application module according to said user operation instruction and said reference data.

3. The method as recited in claim 1, wherein said step of comparing said first test data and said second test data is processed in said application module.

4. The method as recited in claim 1, wherein further test data is generated by the modified re-modification unit via repeating steps of said test method, and further determining whether the original function is retained according to comparison between said further test data and said first test data or said second test data after modifying said re-modification unit.

5. The method as recited in claim 1, wherein a plurality of test data are generated by repeating said steps of said method, and whether the original function is retained after modifying said re-modification unit is determined.

* * * * *